(12) United States Patent
Gervais

(10) Patent No.: US 8,912,800 B2
(45) Date of Patent: Dec. 16, 2014

(54) WIRELESS PORTABLE AUTOMATED HARNESS SCANNER SYSTEM AND METHOD THEREFOR

(75) Inventor: François Gervais, Laval (CA)

(73) Assignee: Ziota Technology Inc., St-Hubert (CA)

(*) Notice: Subject to any disclaimer, the term of this patent is extended or adjusted under 35 U.S.C. 154(b) by 0 days.

(21) Appl. No.: 12/627,620

(22) Filed: Nov. 30, 2009

(65) Prior Publication Data

US 2010/0073007 A1   Mar. 25, 2010

Related U.S. Application Data

(63) Continuation of application No. 10/932,309, filed on Sep. 2, 2004, now Pat. No. 7,368,919.

(51) Int. Cl.
| | |
|---|---|
| *G01R 31/00* | (2006.01) |
| *G01R 31/11* | (2006.01) |
| *G01R 31/02* | (2006.01) |
| *G01R 31/08* | (2006.01) |

(52) U.S. Cl.
CPC ............ *G01R 31/021* (2013.01); *G01R 31/008* (2013.01); *G01R 31/086* (2013.01); *G01R 31/11* (2013.01)
USPC ........... 324/508; 324/503; 324/533; 324/539; 324/540

(58) Field of Classification Search
CPC ............................ G01R 31/008; G01R 31/041
USPC ................................................ 324/508, 539
See application file for complete search history.

(56) References Cited

U.S. PATENT DOCUMENTS

| | | | |
|---|---|---|---|
| 4,204,154 A | * | 5/1980 | Frosch et al. ................. 324/538 |
| 4,218,745 A | | 8/1980 | Perkins |

(Continued)

FOREIGN PATENT DOCUMENTS

JP         06258371 A   *   9/1994    ............ G01R 31/02

OTHER PUBLICATIONS

Deb S et al., "QSI's intetrated diganostics toolset", Autotestcon, 97. 1997 IEEE Autotestcon Proceedings Anaheim, CA, USA Sep. 22-25, 1997, New York, NY, USA, pp. 408-421, XP010253054, isbn: 978-0-7803-4162-3.

*Primary Examiner* — Jermele M Hollington
*Assistant Examiner* — Christopher McAndrew
(74) *Attorney, Agent, or Firm* — Benoît & Côté Inc.

(57) ABSTRACT

The present document describes an assembly for interfacing an existing harness connector of an installed wiring harness to a test module, the assembly comprising: a harness-specific connector for connecting to the existing harness connector; a test box connector module connected to the harness-specific connector and for connecting to a test module, the test box connector module comprising a key which is unique to the test box connector module and which is used to identify the test box connector module when connected to the test module. There is described a method for identifying a test box connector module used in testing an installed wiring harness comprising an existing harness connector, the method comprising: connecting the test box connector module to a test module; detecting a key which is unique to the test box connector module thereby determining the identity of the test box connector module; sending the identity of the test box connector module to a user interface.

12 Claims, 7 Drawing Sheets

(56) References Cited

U.S. PATENT DOCUMENTS

| | | | |
|---|---|---|---|
| 4,251,765 A * | 2/1981 | Mears | 324/503 |
| 4,689,551 A * | 8/1987 | Ryan et al. | 324/539 |
| 4,859,953 A * | 8/1989 | Young et al. | 324/539 |
| 4,870,347 A * | 9/1989 | Cicerone | 324/114 |
| 4,959,792 A | 9/1990 | Sullivan | |
| 5,066,919 A * | 11/1991 | Klassen et al. | 324/538 |
| 5,072,185 A * | 12/1991 | Rockwell | 324/539 |
| 5,208,543 A * | 5/1993 | Albiniak | 324/556 |
| 5,231,357 A * | 7/1993 | Moody et al. | 324/539 |
| 5,250,908 A * | 10/1993 | Liu et al. | 324/542 |
| 5,268,644 A * | 12/1993 | Klassen et al. | 324/503 |
| 5,365,176 A * | 11/1994 | Miller | 324/539 |
| 5,561,372 A * | 10/1996 | Watanabe et al. | 324/538 |
| 5,604,440 A * | 2/1997 | Tomikawa et al. | 324/539 |
| 5,623,199 A * | 4/1997 | Taniguchi et al. | 324/66 |
| 5,831,436 A * | 11/1998 | Borland | 324/503 |
| 5,847,557 A * | 12/1998 | Fincher et al. | 324/66 |
| 5,854,555 A * | 12/1998 | Sasaki | 324/539 |
| 5,903,156 A * | 5/1999 | Matsumaru et al. | 324/533 |
| 6,043,661 A * | 3/2000 | Gutierrez | 324/504 |
| 6,222,374 B1 | 4/2001 | Shoemaker | 324/537 |
| 6,255,828 B1 * | 7/2001 | Rockwell et al. | 324/539 |
| 6,291,770 B1 * | 9/2001 | Casperson | 174/72 A |
| 6,317,836 B1 * | 11/2001 | Goren et al. | 726/36 |
| 6,323,656 B2 * | 11/2001 | Shoemaker | 324/537 |
| 6,420,881 B2 * | 7/2002 | Rockwell et al. | 324/539 |
| 6,442,498 B1 | 8/2002 | Krigel | |
| 6,554,639 B2 * | 4/2003 | Doriski, Jr. | 439/498 |
| 6,593,750 B2 * | 7/2003 | Rockwell et al. | 324/539 |
| 6,611,147 B2 * | 8/2003 | White et al. | 324/539 |
| 6,718,284 B2 * | 4/2004 | Smith et al. | 702/183 |
| 6,744,257 B2 * | 6/2004 | Taniguchi et al. | 324/540 |
| 6,791,336 B2 * | 9/2004 | Krigel | 324/539 |
| 6,882,158 B2 * | 4/2005 | Blades | 324/536 |
| 6,960,102 B2 * | 11/2005 | Styles | 439/604 |
| 7,012,436 B1 * | 3/2006 | Pannell et al. | 324/539 |
| 7,068,044 B1 * | 6/2006 | Lo et al. | 324/534 |
| 7,095,240 B2 * | 8/2006 | Wilson | 324/539 |
| 7,112,969 B1 * | 9/2006 | Thomas | 324/539 |
| 7,277,822 B2 * | 10/2007 | Blemel | 702/183 |
| 7,423,434 B2 * | 9/2008 | Stancil | 324/539 |
| 7,495,452 B2 * | 2/2009 | Hayashi et al. | 324/538 |
| 7,696,760 B2 * | 4/2010 | Lindsey et al. | 324/538 |
| 7,728,605 B2 * | 6/2010 | Gervais | 324/539 |
| 7,884,616 B2 * | 2/2011 | Oruganty | 324/539 |
| 7,902,832 B2 * | 3/2011 | Shimamura et al. | 324/539 |
| 8,069,556 B2 * | 12/2011 | Selbach | 29/755 |
| 8,179,144 B1 * | 5/2012 | Lo et al. | 324/533 |
| 2002/0147561 A1 * | 10/2002 | Baracat et al. | 702/119 |
| 2003/0006779 A1 * | 1/2003 | Youval | 324/503 |
| 2003/0141878 A1 * | 7/2003 | Shinzou et al. | 324/539 |
| 2003/0163917 A1 * | 9/2003 | Davidshofer et al. | 29/854 |
| 2004/0070491 A1 * | 4/2004 | Huang et al. | 340/10.5 |
| 2006/0043976 A1 * | 3/2006 | Gervais | 324/508 |
| 2008/0297164 A1 * | 12/2008 | Carpio et al. | 324/537 |

\* cited by examiner

WIRELESS PORTABLE AUTOMATED HARNESS SCANNER SYSTEM AND METHOD THEREFOR

CROSS-REFERENCE TO RELATED APPLICATIONS

This application claims priority under 35USC§120 of allowed U.S. non-provisional patent application Ser. No. 10/932,309, filed Sep. 2, 2004, bearing the same title, the specification of which is hereby incorporated by reference.

TECHNICAL FIELD

The invention relates to a system and method for testing and repairing installed wiring harnesses.

BACKGROUND OF THE INVENTION

An electrical wiring harness typically comprises a bundle of individual connector wires of varying gauges, impedances and types, all arranged and distributed at different locations within an installation, such as a transport vehicle. Such wiring harnesses are usually bound together in order to facilitate the installation, repair and maintenance of the wires. The transport vehicle industry, especially the aviation and the automobile industries, makes extensive use of such wiring assemblies.

In the aircraft industry, wiring harnesses are used to interconnect the various components and subassemblies located within an aircraft. The number of possible electrical interconnections within a harness grows exponentially with the number of wires and connectors. Therefore, electrical problems within a harness are incredibly hard to identify and locate, especially for already installed harnesses.

In the prior art, a typical method of testing an installed harness is by using a ringing cable. Unfortunately, such a method is inconvenient as it presents numerous drawbacks. Such a method requires that a plurality of operators be deployed at various connection points along the wiring harness, their locations being chosen in accordance with electrical schematics, and the operators communicating and coordinating testing procedures through walkie-talkies. With prior art methods, the operators have to ring cables, one at a time, which requires many operators for complex or multiple connections.

Another prior art method of testing a wiring harness involves connecting devices to the installed harness via cables and performing the testing. However, such a method requires installation of interface cables and other components from the system for testing. Additionally, it requires the deployment of many operators and the use of maintenance manuals, which makes the process time-consuming, expensive and prone to human error.

Another problem in the prior art is that of keeping accurate records of the results of testing and maintenance procedures. Currently, such information is manually recorded by operators into wiring diagrams and/or work orders, a practice which is prone to errors and omissions and which does not allow for analysis of the data recorded over time.

Testing devices such as TDR testing units have been developed to test wiring harnesses, one wire at a time. Unfortunately, prior art TDR methods do not allow for performing testing on multiple wires at a time, which proves to be time consuming and does not allow for gathering complete and accurate information regarding the wires.

There exists therefore a need for a system and a method for testing an installed wiring harness, which is time and cost efficient.

Additionally, there exists a need for a system and method for testing an installed wiring harness, which is not prone to human error.

Furthermore, there exists a need for adequate documentation following testing procedures.

According to an embodiment, there is provided a method for testing an installed wiring harness, comprising: providing a signal source testing module at a first connection point in the wiring harness; providing a measurement termination testing module at a second connection point in the wiring harness; providing a central management module for controlling the testing modules to coordinate the testing modules to send testing signals from the first connection point to the second connection point, after disconnecting electrical power between the connection points, for performing tests and recording test measurements of the installed wiring harness; and the signal source testing module and measurement termination testing module for sending the test measurements to the management module.

According to an embodiment, there is provided a system for offline testing of an installed wiring harness, comprising: at least a first and a second testing module, having: a communication module for receiving test specifications and for sending test measurements; testing equipment for generating the test measurements from the test specifications; each of the first and second testing modules being adapted for connection at a connection point in the wiring harness; a central network management module, having: a communication module for providing the test specifications to the testing modules and for receiving the test measurements; and a test management module for controlling the testing modules.

SUMMARY OF THE INVENTION

Accordingly, an object of the present invention is to provide a system and method for testing an installed wiring harness, which allows automated testing of multiple lines simultaneously, thereby reducing the time and the cost of the testing procedure.

It is another object of the present invention to provide a system and method for testing an installed wiring harness, which is automated, thereby eliminating human error.

It is yet another object of the present invention to provide a system and method for testing an installed wiring harness which allows to produce automatically standardized maintenance reports and electronic logbook.

According to an aspect of the invention, there is provided a method for testing an installed wiring harness, comprising: providing a signal source testing module at a first connection point in the wiring harness; providing a measurement termination testing module at a second connection point in the wiring harness; providing a central management module for controlling the testing modules to coordinate the testing modules to send testing signals from the first connection point to the second connection point, after disconnecting electrical power between the connection points, for performing tests and recording test measurements of the installed wiring harness; and the signal source testing module and measurement termination testing module for sending the test measurements to the management module.

According to another aspect of the invention, there is provided a system for offline testing of an installed wiring harness, comprising: at least a first and a second testing module, having: a communication module for receiving test specifications and for sending test measurements; testing equipment for generating the test measurements from the test specifications; each of the first and second testing modules being adapted for connection at a connection point in the wiring harness; a central network management module, having: a communication module for providing the test specifications to the testing modules and for receiving the test measurements; and a test management module for controlling the testing modules.

According an embodiment, there is provided an assembly for interfacing an existing harness connector of an installed wiring harness to a test module, the assembly comprising: a harness-specific connector for connecting to the existing harness connector; a test box connector module connected to the harness-specific connector and for connecting to a test module, the test box connector module comprising a key which is unique to the test box connector module and which is used to identify the test box connector module when connected to the test module.

According an embodiment, there is provided a method for identifying a test box connector module used in testing an installed wiring harness comprising an existing harness connector, the method comprising: connecting the test box connector module to a test module; detecting a key which is unique to the test box connector module thereby determining the identity of the test box connector module; sending the identity of the test box connector module to a user interface.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION

Figure 4:
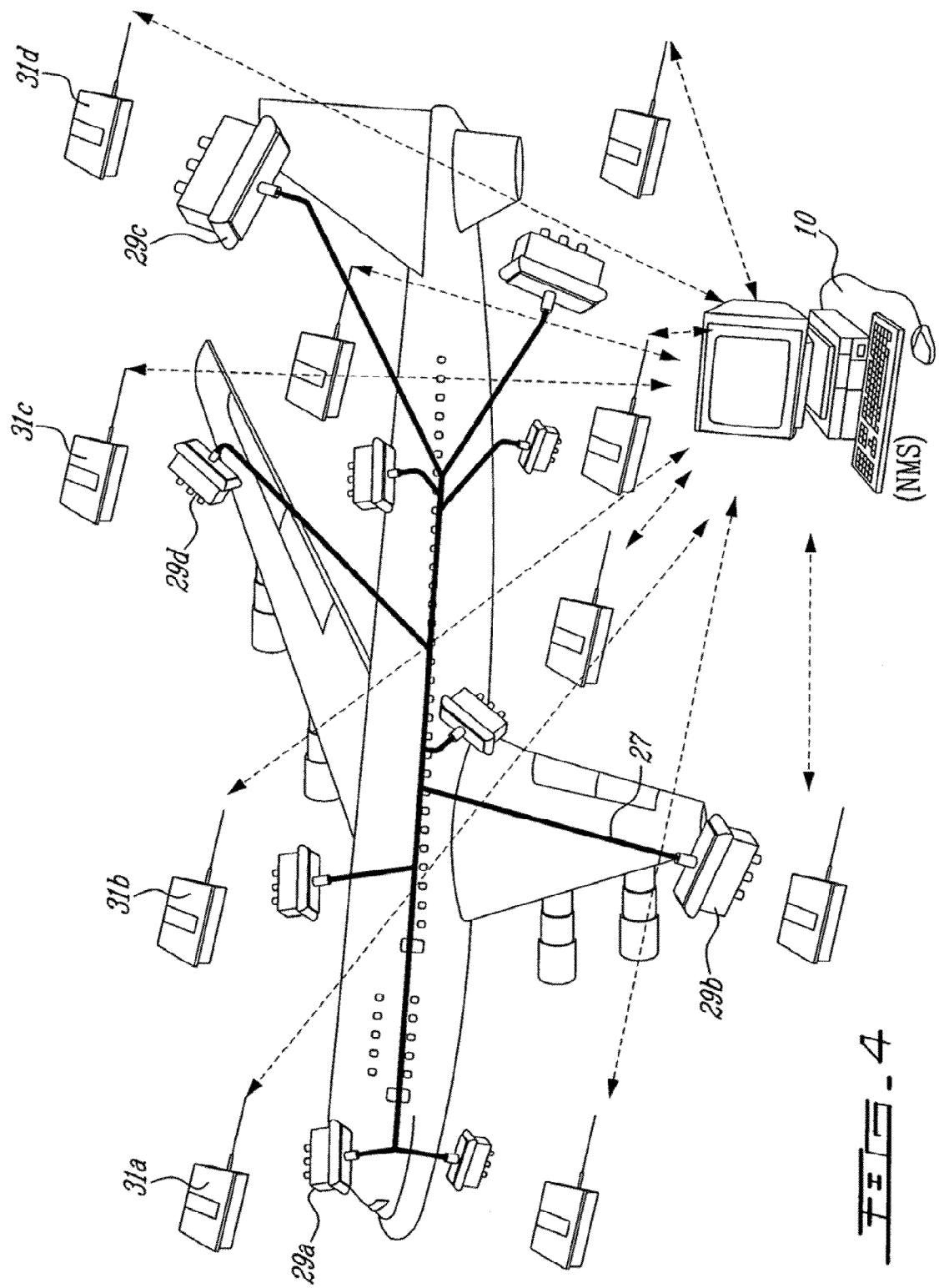
FIG. 4 is a diagram of an automated harness scanner system having a central management system and distributed test modules according to a preferred embodiment of the present invention.

As illustrated in FIG. 4, the present invention is a fully portable automated test system allowing verification of any type of installed wiring harness 27 using a new open platform architecture for the transport industry. Even though the testing system shown in FIG. 4 is used for testing a wiring harness installed in a plane, the testing system could also be used for testing a wiring harness installed in any other installation for which periodical testing, diagnosis and maintenance is required. Such other installations might include, but are not limited to, boats, ships, trains, cars, etc.

In the preferred embodiment of the present invention, the automated testing system is a distributed network, comprising a plurality of test modules 31 which are connected to the wiring harness 27 at the location of existing harness connectors 29. The test modules 31 are in communication with a central Network Management System (NMS) 10, from which the test modules 31 receive information regarding the testing of the wiring harness 27 and to which they send back test results following completion of testing.

In one embodiment of the present invention the test modules 31 communicate with the NMS 10 over a wireless connection, using a protocol such as TDMA in order to support a large number of test modules 31, such as in the case of testing a wiring harness 27 having a plurality of connectors at different locations. It is however within the scope of the present invention that the test modules 31 send and receive information through a cable connection.

The NMS 10 is preferably a computer system having input means, display means and storage means and/or other components well-known to those skilled in the art. In the preferred embodiment of the present invention, the computer system includes, for example, a central processing unit (CPU), random access memory (RAM), read-only memory (ROM), as well as various peripheral devices, each connected to a local bus system. Also coupled to the local bus system are a mass storage device, a keyboard, a pointing device (mouse, trackball, touchpad, etc.), a communication device, etc. The communication device is any device allowing the computer system 11 to communicate with a remotely located device over a communication link, such as a telephone modem, cable modem, ISDN, wireless, etc.

Now, with respect to FIG. 1, the preferred architecture of the NMS 10 according to the present invention will be described. The data management module 13 contains all the software required to interface with external storage module 14 as well as the NMS data storage 12. The external storage 14 contains an electronic logbook unique to each transport vehicle, which contains all transport vehicle electrical information, wiring harness signature and past test results. The NMS storage 12 contains all the historical data, statistical variation data and modeling information for a particular wiring harness 27. The data management module 13 is a software configuration management tool allowing to control and validate information to be stored in the transport vehicle electronic logbook and NMS storage 12. Compression data algorithms are preferably used for storing and managing data in an efficient manner on the storage units 12, 14.

The data management module 13 receives data from a signature builder module 11. The signature builder module 11 generates a wiring harness signature for a given transport vehicle harness 27 based on manufacturing specs. The module 11 generates a listing of the transport vehicle wiring harness basic characteristics and properties in terms of material, gauge, length, resistance, impedance, tolerance, conductivity, cross-talk, insulation and many more. The wiring harness signature may be uploaded by transferring raw data from the transport vehicle manufacturer database. This can be achieved by directly accessing the database or by providing the manufacturing specs on a CD-ROM to the system. Alternatively, the wiring harness signature can be generated by connecting the testing system to the transport vehicle wiring harness 27. In the case the wiring harness signature is generated, it is the artificial intelligence module 15 that provides it to the data management module 13.

The artificial intelligence module 15 is a self-learning tool for optimization which enables modification of its own program based on its learning experience. The artificial intelligence module 15 provides diagnosis and recommendations based on historical data, models and test data results received from the test modules 31 through the communication module 21.

Figure 3:
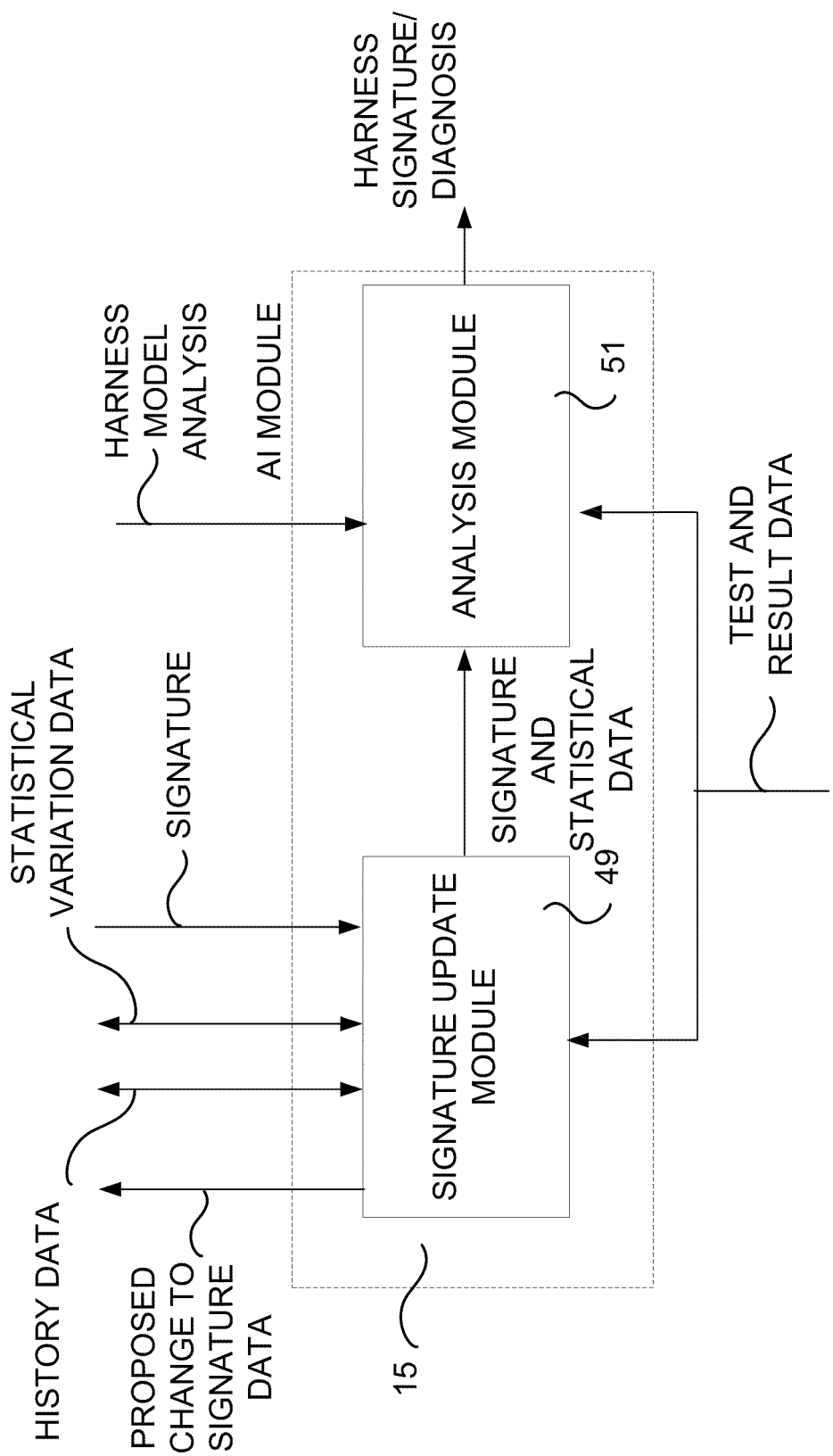
FIG. 3 is a block diagram of an analysis module according to a preferred embodiment of the present invention.

As shown in FIG. 3, in the preferred embodiment of the present invention, the artificial intelligence module 15 includes a signature update module 49 and an analysis module 51. The signature update module 49 manages historical data, statistical data and signature updates from test results received from test modules 31. If a signature is not available for a given installed wiring harness 27, the signature module 49 allows building a signature by performing a series of test and gathering a set of electrical characteristics of the wiring harness 27. When the signature update module 49 receives the test results from all the test modules 31 and no signature is available for a specific transport vehicle wiring harness 27, then it will generate and store the harness signature. The signature update module 49 will propose signature changes to the Data Management module 13 by requesting the storage of all information previously detected and measured such as connectivity table, Netlist, which describes the connectivity of the wiring harness, or the wire mapping between each connection point, and includes each of the wires' physical attributes, and all electrical characteristics measured and provided by test modules 31 in the format of a harness signature.

The electrical harness signature contains information that is unique for each wire of the wiring harness 27. The harness signature for each wire describes the electrical characteristics of that particular wire. In the preferred embodiment of the present invention, the harness signature is a multiple-dimensional array. Table 1 illustrates an exemplary harness signature structure:

TABLE 1

| VARIABLE | TYPE |
| --- | --- |
| CONNECTION | DYNAMIC MULTIPLE DIMENSION ARRAY |
| WIRE SPECIFICATION | ARRAY |
| DC MEASUREMENTS | ARRAY |
| AC MEASUREMENTS | ARRAY |
| SWR MEASUREMENTS | ARRAY |
| SWR RETURN SIGNALS | DYNAMIC MULTIPLE DIMENSION ARRAY |
| TDR RETURN SIGNALS | DYNAMIC MULTIPLE DIMENSION ARRAY |
| SPECTRUM IMPEDANCE MEASUREMENTS | DYNAMIC MULTIPLE DIMENSION ARRAY |

The connection variable is a dynamic, multiple-dimension array containing information in wire connection to other points in the wiring harness 27. The wire specification variable is an array of manufacturer specifications, such as conductor material, shielding material, gauge, insulation, conductance, dilatation, etc.

The "DC measurements" variable is preferably an array containing measured voltage and current values, as well as resistance and conductance values.

The "AC measurements" variable is another array containing voltage and current values measured for different AC input signals. In the preferred embodiment of the present invention, sinusoidal signals of 1 kHz, 100 kHz and 1 MHz of 1 V peak-to-peak are used as input signals. The AC measurements include values of calculated impedance.

The "SWR measurements" variable is an array containing time delay values for the return signal from an input sinusoidal signal. In the preferred embodiment of the present invention, sinusoidal signals of 1 kHz, 100 kHz and 1 MHz of 1 V peak-to-peak are used as input signals. The SWR measurements also include values of calculated conductor length or break point based on the Doppler equations.

The "SWR return signals" variable is a dynamic multiple dimension array containing all sample data points for the return signal from an input sinusoidal signal.

The "TDR return signals" variable is a dynamic multiple dimension array containing all sample data points for the return signal from an input pulse signal, sent at various frequencies, preferably at 1 KHz, 100 KHz and 1 MHz.

The "Spectrum impedance measurements" variable is another dynamic multiple dimension array containing measured impedance values, in polar and vector form, for a 1-V peak-to-peak input sinusoidal signal. Preferably, the input sinusoidal is varying over a frequency spectrum from 1 KHz to 1 MHz in steps of 50 KHz. This array contains as well calculated Nyquist plot data over the 1 KHz to 1 MHz spectrum.

The artificial intelligence module 15 also includes an analysis module, which is a self-learning module with the capability to give a diagnosis and recommendation on a transport vehicle wiring harness 27. The analysis module 51 receives test results from the test modules 31. Also, this module 51 receives the harness signature and statistical data from the signature update module 49. Then, this module retrieves the wiring harness model from the NMS storage 12 through the data management module 13 to perform a diagnosis and recommendation. The diagnosis/recommendation is sent to the test management module 17. Finally, this module will decide to send or not a new harness model analysis to the data management module 13 based on the new learning experience.

The test management module 17 sends the test specification regarding the measurements to be performed by each of the test modules of the system. The test management module 17 is also in communication with an analysis module 15 for receiving either a diagnosis or recommendations and a harness signature for the wiring harness 27. The test management module can also provide this information for the operator through a report module 23 or a user interface module 25.

The test management module 17 communicates with the network of distributed test modules 31 through a communication module 21. In the preferred embodiment of the present invention, the communication module is a transmitter (emitter/receiver) communicating to each test module 31 using a STAR configuration. The module 21 is a HUB assigning and managing all frequencies, signal strength, power and time slots in the testing system.

The report module 23 is an automated tool used to format special printouts, such as metallic labels, cable prints, as well as parts and inventory numbers. The report module 23 may also be used as a tool for generating Quality Assurance and maintenance reports including the test results collected during a given test session or past test results. The report module 23 receives all the information required from the test management module 17.

The user interface module 25 controls all the man machine interfaces required for data input and output. It can display on-line schematic diagrams, Netlists and any wire characteristics and properties, as well as the transport vehicle electronic logbook.

The maintenance management module 19 is an assistance tool to any operator using the automated testing system. It provides a step-by-step procedure to guide the operator in testing a transport vehicle wiring harness 27 for a specific vehicle sub-system. The maintenance management module 19, through the user interface module 25, prompts the operator by asking which sub-system to test and provides the user with information regarding the number of test modules required, where to connect them and their location within the transport vehicle.

In a first step, the operator would identify a faulty subsystem within the wiring harness 27, by using on-board computers with built-in self-test (BITES) capabilities. If the subsystem cannot be identified by the BITES, the operator will review indicators, sensors information as well as the pilot's flight book to identify the subsystem.

The operator will then load a specific CD-ROM aircraft logbook in the computer, which contains all wiring harness information for the particular aircraft. The system first prompts the operator to enter the aircraft sub-system to test. Then, the HS2000 maintenance program replies with the number of test modules 31 and test box connectors modules required to perform the test as well as the locations of aircraft connectors to be tested.

The operator then disconnects the aircraft-specific harness connector 29 from the aircraft wiring harness 27 and connects the test module 31 with the appropriate connector module 33. Then, the operator powers on the test module 31, at which time the test module is automatically assigned a system ID by the NMS. The system ID contains a time slot, frequency and signal strength according to the TDMA protocol. This procedure is repeated for all test modules 31 to be connected.

After having installed all test modules 31, the operator then returns to the computer to start the testing routine. If any problems occurred during installation, the system will notify the operator. Otherwise, the operator is prompted to start the test. In this example, the operator starts the landing gears controls sub-system test on the computer and receives the test results indicating any electrical wiring problems, faults and their locations.

The operator will then visually inspect the locations at which the problems/faults have been identified. Then, the operator will carry on the repair (splice, solder, connector).

Then the operator returns to the system 10 to retest the sub-system under test and the system provides a new set of test results from the electrical wiring harness. If no other problems are detected, the new harness signature is recorded in the system 10.

As a last step, the operator returns to the aircraft and connects all harness-specific connectors 29 to aircraft harness 27 equipment. Then, the operator re-runs the BITES on the subsystem under test or directly performs some trials on the aircraft harness 27 equipment. If problems are identified on the aircraft harness 27 equipment, then the operator restarts the testing procedures.

If no problem occurs, a work order will be issued with the details of the repairs, validated by maintenance quality controls, and registered in the company database. Also, the new electrical harness signature, schematics updates, notes and all other aircraft changes will be recorded in the aircraft electronic logbook, which as in this example, could be a CDROM. Finally, the aircraft electronic logbook is stored in the aircraft. In the example, the logbook is on CDROM and kept in the aircraft.

A test module 31 is the component that contains all testing equipment required in order to generate the measurements data to support any test specifications. The Test Specification information received from the NMS 10, through the communication module 47, is processed by the measurement management module 45 and sent to the appropriate testing units.

Figure 1:
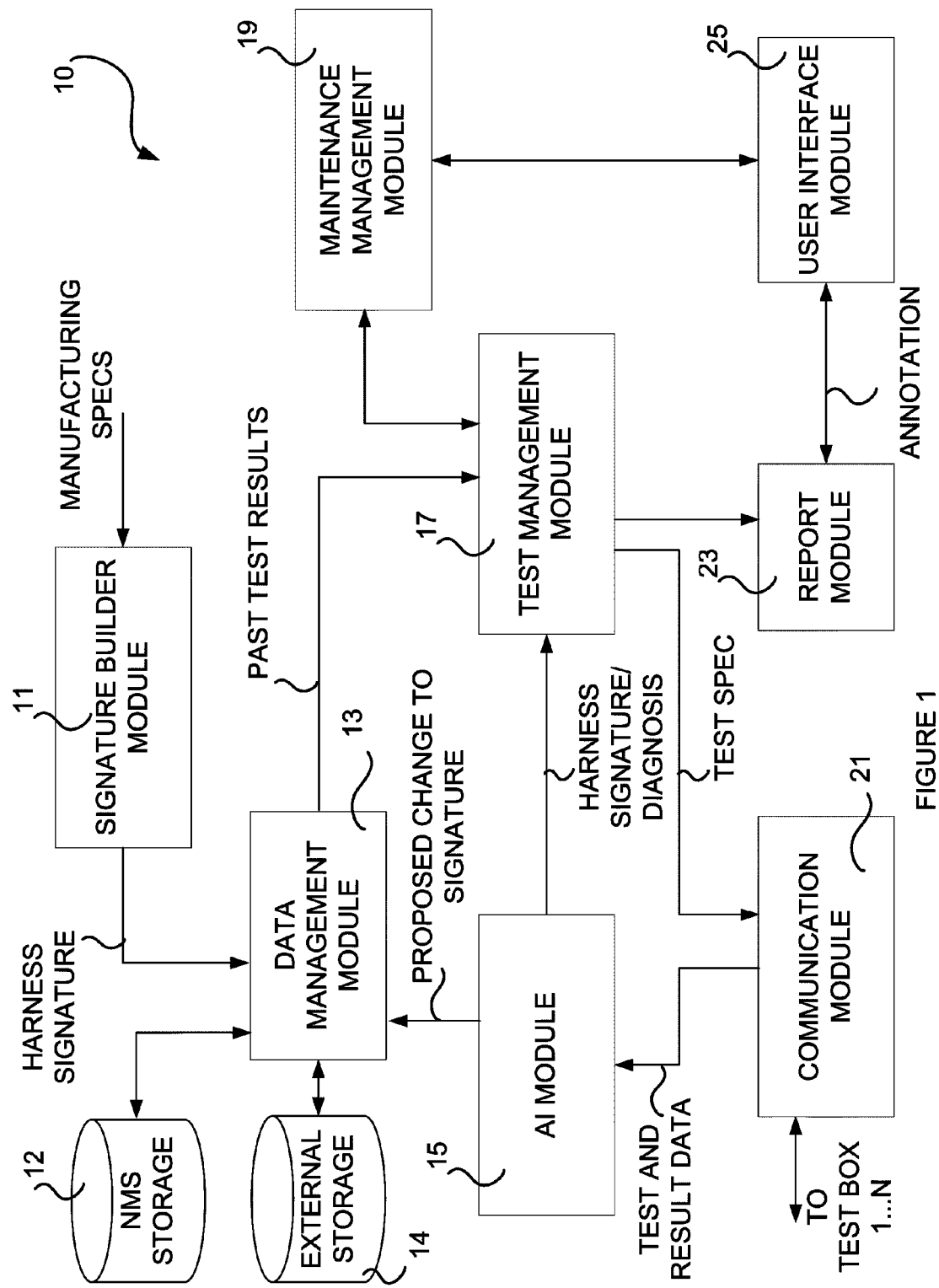
FIG. 1 is a block diagram of an automated harness scanner system according to a preferred embodiment of the present invention.
Figure 2:
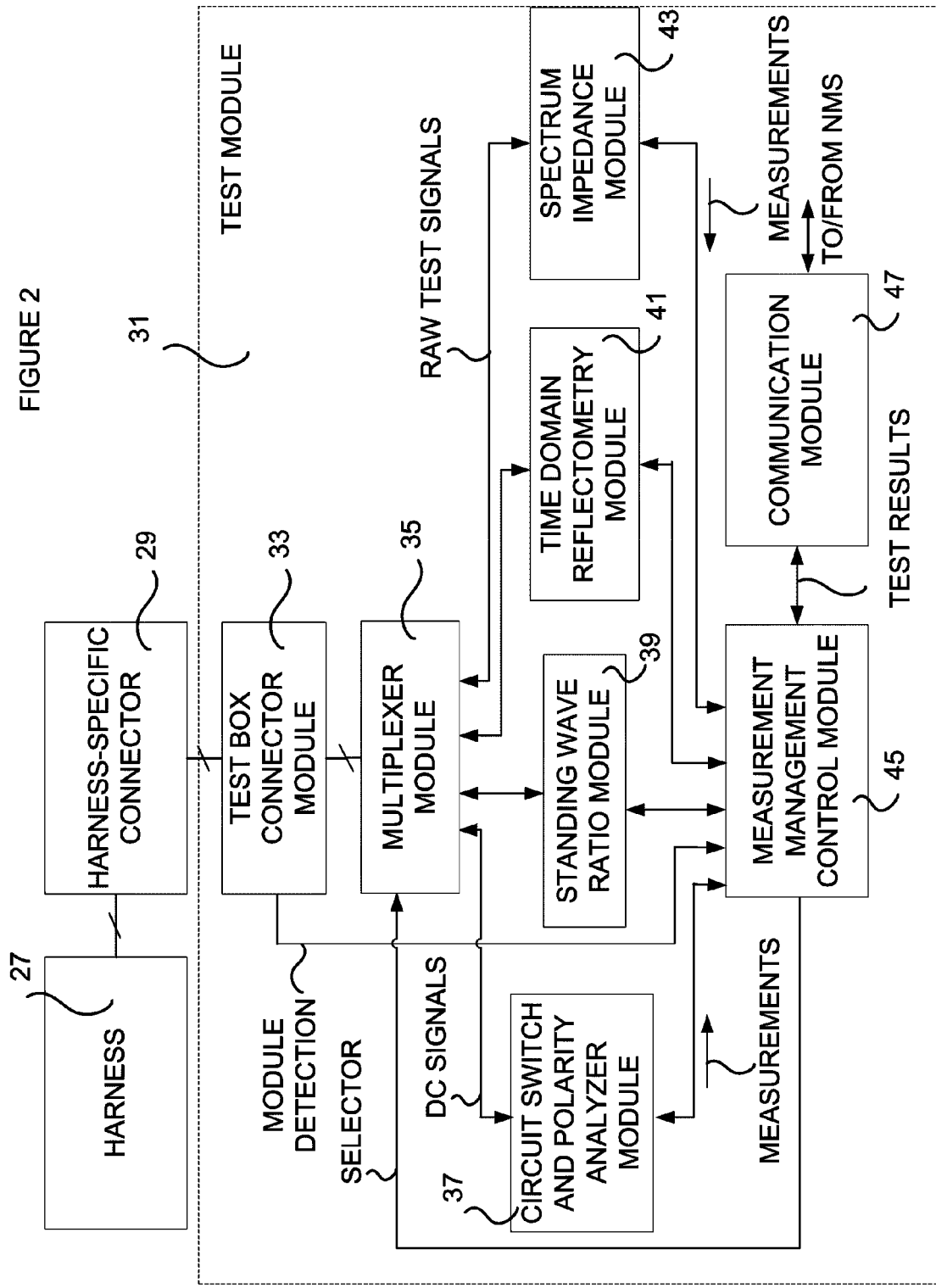
FIG. 2 is a block diagram of a test module connected to a wiring harness according to a preferred embodiment of the present invention.

Now referring to FIGS. 1, 2, and 4, test modules 31 connect to a harness-specific connector 29 through a connector module 33. Each connector module 33 can be customized for a specific type of harness connector 29 or can be of a generic standard connector type. A connector module 33 can be connected to more than one harness-specific connector 29. The connector module 33 is auto-detected and controlled by the measurement management control module 45 to identify the number and type of harness-specific connectors 29 available to be connected to the test modules 31. Then, the information about the connectors available for test is sent to the test manager module 17. The harness-specific connectors 29 connected to the test box connector module 33 are switched and scanned by the multiplexer module 35.

The multiplexer module is a circuit switch multiplier, which can be cascaded as needed to achieve a predetermined number of test points. It is controlled by the measurement management module 45 and redirects any signals to the right harness-specific connector 29 wires to be tested.

The measurement management control (MMC) module 45 receives, through the communication module 47, test Specification from the NMS 10. The MMC module 45 determines which testing units 37, 39, 41, 43 are required to produce raw data measurements. The module 45 then coordinates and synchronizes the testing units to avoid any interference. The MMC module 45 detects the test box connector module 33 connected to the test modules 31 using a hardware coded key, which is unique to each test box connector module 33. The MMC module 45 sends the list of connectors available to connect the harness specific connector module 29 to the NMS 10. Then, the operator will know which connector on the test box connector module 33 to plug the harness specific connector 29. Also, the MMC module 45 controls the connector selections and the wires scanning for each connector. Finally, it produces, stores and sends test results information to the NMS 10. The test results are produced by equipment measurements, but also by correlating the measurements received from the Standing Wave Ratio (SWR) module 39, Time Domain Reflectometry 41 and spectrum impedance 43 modules. Such combined information is used specifically for shielding wire detection, cross-talk and coupling problems. Signal data processing is used on the return signal from the SWR module 39, TDR module 41 and Spectrum Impedance module 43 to extract and store the information required to characterize the actual condition of the wire. Then, information from the three modules are correlated and aligned with a transmission line model and wire specification under test. Finally, the information is sent to NMS 10 to compare with the previous harness signature and to get a diagnosis.

Figure 5:
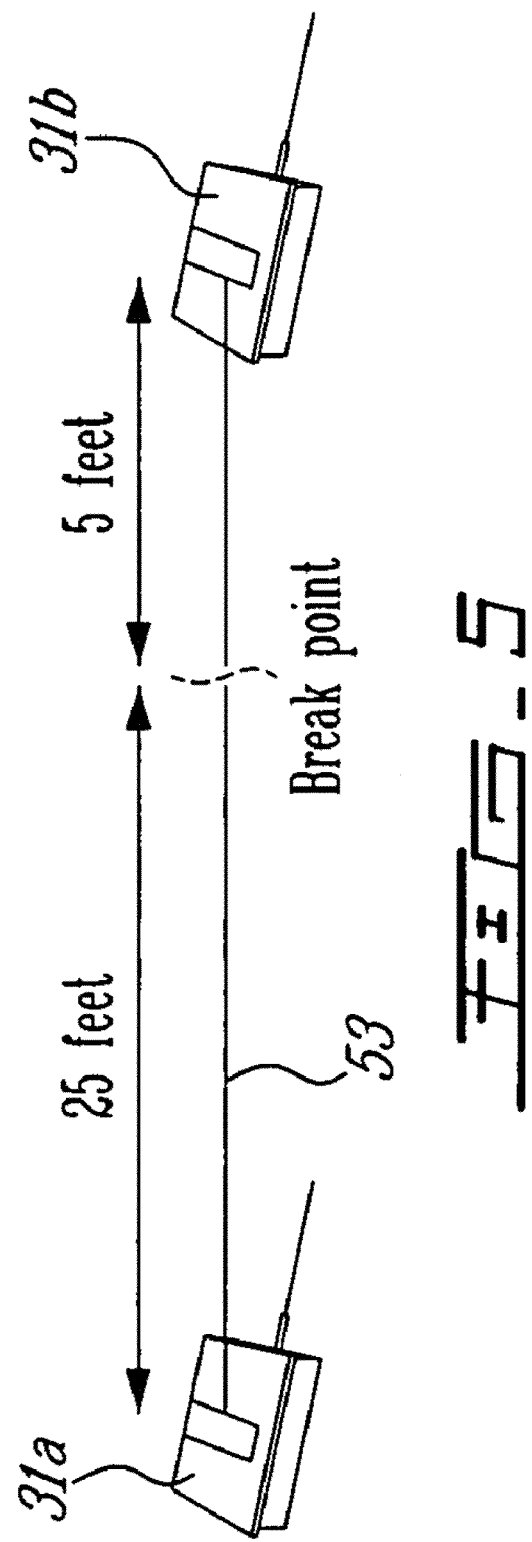
FIG. 5 is a schematic diagram of two test modules installed in a wiring harness, testing a wire showing a break point.

In the preferred embodiment of the present invention, the initial harness signature is generated from specifications given by the electrical harness manufacturer or tests performed on the harness. Whenever a test is performed on the wiring harness 27 and a previous signature exists, the signature comparison is performed as follows. First, a Netlist comparison is performed to verify all connectivity differences between the existing signature "connection" variable and the new measurements. The Al module 15 will perform the comparison. At the same time, the "DC measurements" and "AC measurements" variables are used to determine whether any "open or "short" problems are present within the harness. If any are detected, the Al module 15 uses the "SWR measurements" from the signature to determine the break point location of "open" or "short" within the length of the wire. As per FIG. 5, the system uses a test box unit "TBU" at each end of the wire, giving more precision as to the location of the break point within the length of the conductor.

The AI module 15 then uses the "SWR return signals", "TDR return signals" and "Spectrum impedance measurements" in order to detect shielding defects. The information provided by the "TDR return signals" data and the "Spectrum impedance measurements" is used with correlation algorithms well known in the art to detect a shielding defect. Whenever a shield defect has been identified, the AI module 15 determines its exact location by using the "SWR return signals" data. Signal processing including moving range, correlation and data mining algorithms are used in order to detect the location of a shielding problem.

Figure 6:
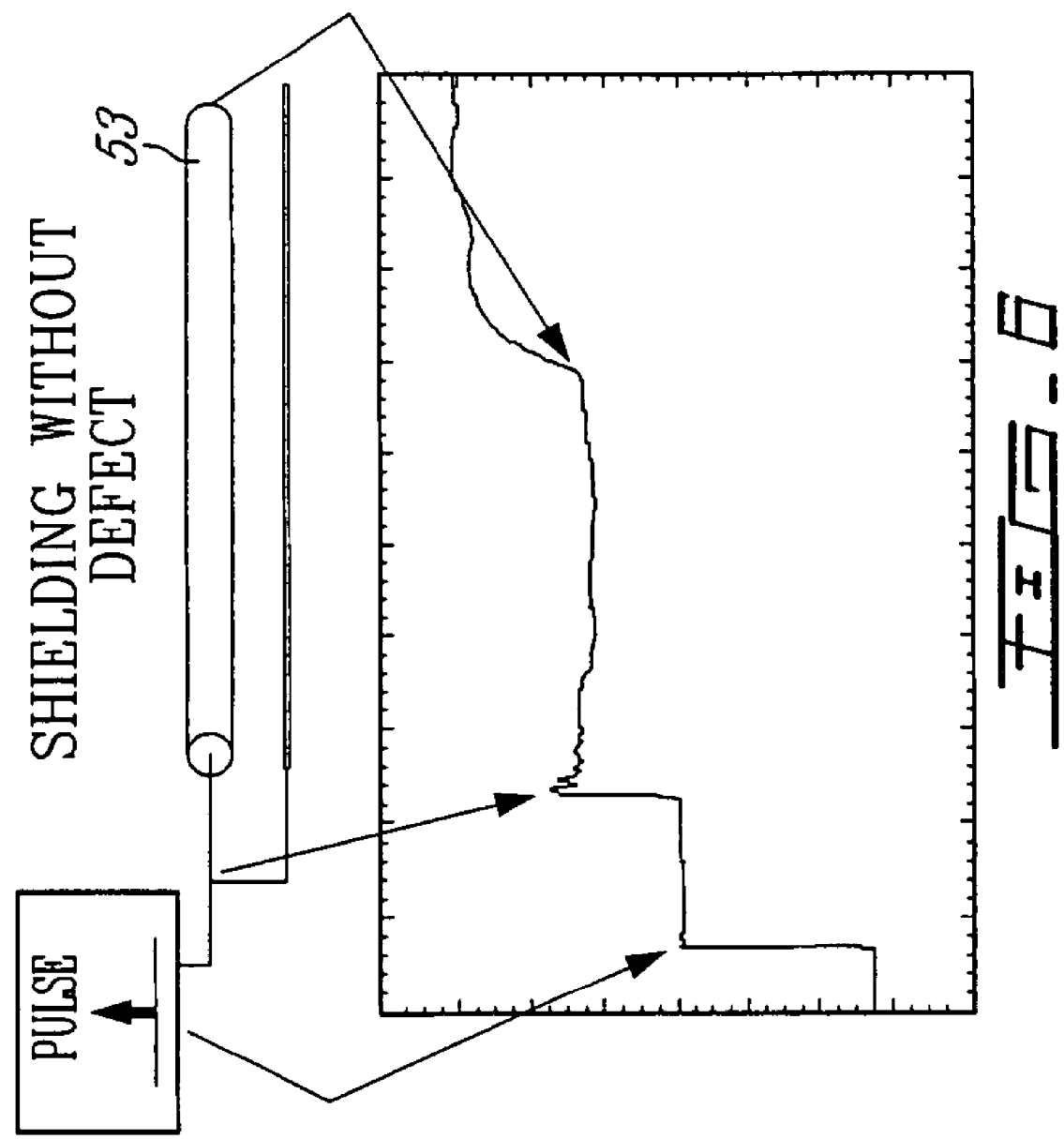
FIG. 6 is a graph of an exemplary TDR return signal obtained when applying a pulse input signal to a wire without shielding defects.
Figure 7:
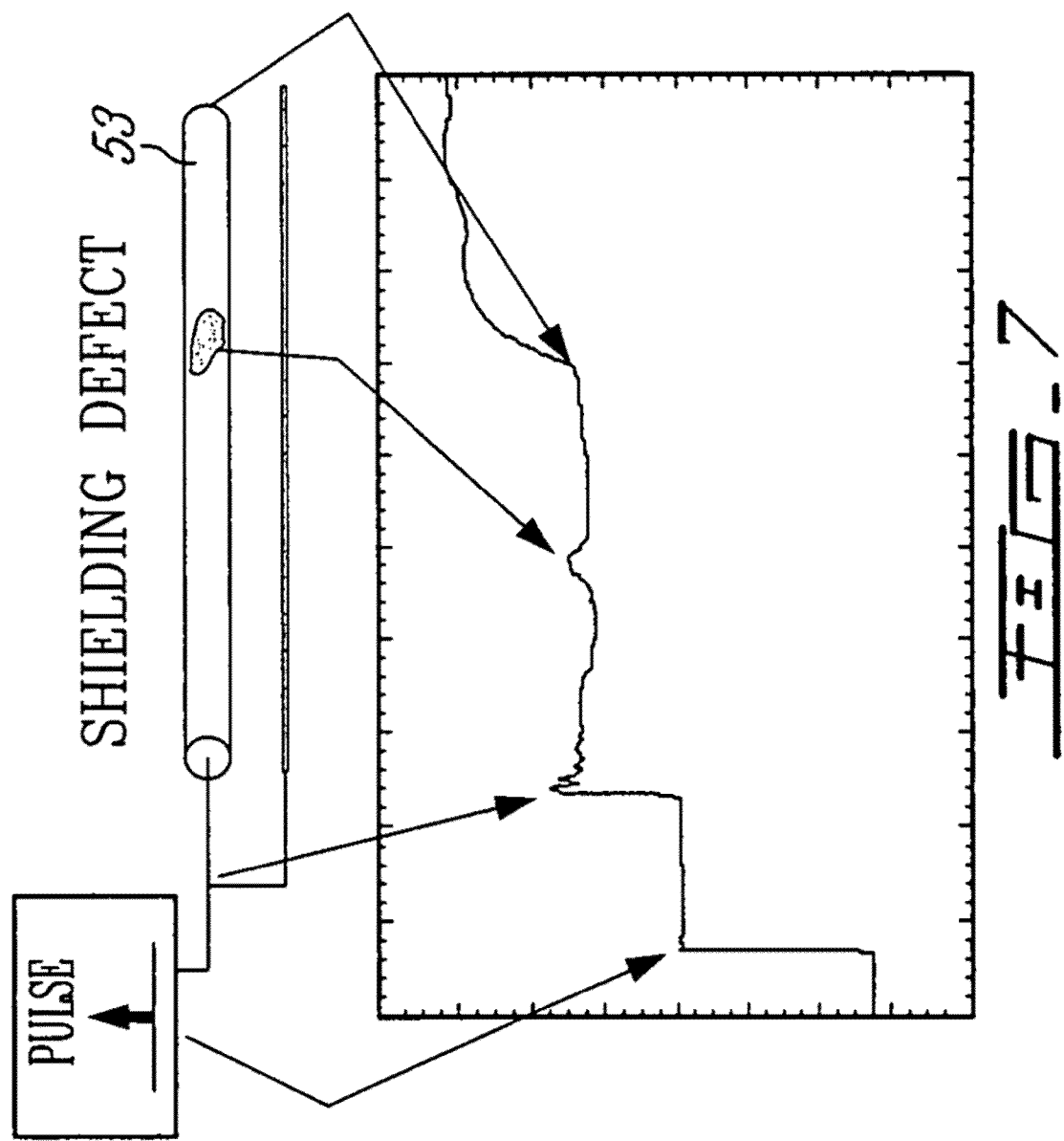
FIG. 7 is a graph of an exemplary TDR return signal obtained when applying a pulse input signal to a wire with shielding defects.

FIG. 6 illustrates the "TDR return signal" from a previous harness signature, in which no shielding defect is present. FIG. 7 shows the "TDR return signal" received after performing a series of measurements on the same harness after some time. FIG. 7 shows a shielding defect present in one of the wires.

In the preferred embodiment of the present invention, the AI module 15 uses previously stored "TDR return signal" data to compare the received "TDR return signal" data. If a shielding problem is detected, then the AI module 15 applies correlation and data mining algorithms to the received "TDR return signals" data and the received "Spectrum impedance measurements" to determine the size of the shielding defect. The AI module 15 then uses "SWR return signals" data with moving range/Doppler algorithms to determine the location of the shielding defect. The AI module 15 can use the other variables data in the received signature whenever more data or calculations are required by the AI models to determine the size or location of shielding defect.

In the case in which the analysis of the received "TDR return signal" data shows a difference when compared to the stored "TDR return signal" data, the significance of the change is assessed in order to determine the gravity of the problem. At the time of analysis of the data, the relationship between the physical wire characteristics and the electrical properties of the wire being tested would be taken into account. The relationship between the two would be used to assess the impact of a change in the physical wire characteristics on the electrical properties of the wire. Another factor taken into account by the AI module 15 when performing the assessment is the actual use of the wire being tested. For example, the type of voltage and current carried by the wire would play a role in determining the sensitivity of the electrical properties of the wire to changes in its physical characteristics. Such a complete assessment performed by the AI module 15 would allow to provide different diagnostics and recommendations depending on the gravity of the detected problem. In one case, upon detecting a shielding defect in a wire being tested, the AI module 15 might recommend that the wire be replaced, in other cases, the AI module 15 might recommend that the wire simply be submitted to a visual inspection, while in other cases, the change would simply be recorded in the electrical signature without signaling a defect. It is knowledge about the use of the wire within the harness system 27 that would allow the AI module 15 to set different pass/fail thresholds for different types of wire and to make recommendations accordingly.

Now, returning to FIG. 2, the communication module 47 receives test specifications from the NMS 10 and sends back test results. In the preferred embodiment of the present invention, the communication module 47 is a slave transceiver (Transmitter/Receiver). The module 47 receives information from the NMS 10 and passes it to the MMC module 45.

In the preferred embodiment of the present invention, and as shown in FIG. 2, a test module 31 includes testing units such as: a circuit switch and polarity analyzer module 37, a standing wave ratio (SWR) module 39, a TDR module 41 and a spectrum impedance module 43.

The main functions of the circuit switch and polarity analyzer module 37 are to perform a continuity test and an active electronic components verification test. Also, this module 37 performs all DC testing of the transport vehicle wiring harness 27. The module 37 contains the following two sub-modules: a circuit switch analyzer and a polarity analyzer.

The circuit analyzer performs a continuity check for all possible harness connections and produces a mapping connection, which is stored in a table. The polarity analyzer performs a test to verify any active components like transistor, diode or semi-conductors in the wiring harness 27. The polarity analyzer verifies and determines the direction of the current and gathers all the raw data required by the AI module 15.

The standing wave ratio module 39 is a testing unit, which sends a pure sinusoidal wave through each conductor of the wiring harness 27 and measures the return in terms of time, voltage and sinusoidal shape. It contains a unique "Transmission Line Model" specific to the transport vehicle industry and a state-of-art data signal processing system in order to analyze the return signal. The SWR module 39 can calculate the break point of a conductor in the wiring harness 27 using Doppler equations. This module 39 generates raw data measurements required by the NMS 10 for providing a diagnosis of the wiring harness 27.

The Time Domain Reflectometry (TDR) module 41 is a testing unit, which sends a small amplitude pulse through each conductor of the wiring harness 27 in order to characterize it. It uses Fast Fourier Transforms (FFT) and Laplace Transforms to compute and produce raw data measurements and a state-of-art data signal processing system to extract and analyze the return signal.

The spectrum impedance module 43 is a testing unit, which measures AC resistance with different signal voltage over a spectrum of specific frequencies. The spectrum impedance module 43 produces polar and vector representations for each wire impedance over a specific frequency spectrum (Nyquist plot). Also, the spectrum impedance module 43 uses a state-of-art of data signal processing system to extract and analyze the return signal for each frequency. The module 43 generates raw data required by the NMS 10 and stores the information in a table. In the preferred embodiment of the present invention, this module 43 has auto-range calibration abilities using the successive approximation method.

The embodiments of the invention described above are intended to be exemplary only. The scope of the invention is therefore intended to be limited solely by the scope of the appended claims.

The invention claimed is:

1. An assembly for interfacing an existing harness connector of an installed wiring harness to a test module, the assembly comprising:
   a harness-specific connector for connecting to the existing harness connector;
   a test box connector module connected to the harness-specific connector and for connecting to a test module, the test box connector module comprising a key which is unique to the test box connector module and which is used to identify the test box connector module when connected to the test module and to identify the harness-specific connector by reference to a user-defined list or database, the harness-specific connector being a separate and distinct entity from the test box connector module,
wherein the test box connector module is automatically detected by the test module.

2. The assembly of claim 1, wherein the key comprises a hardware coded key which may be programmable or not.

3. The assembly of claim 1, wherein the harness-specific connector comprises more than one harness-specific connector for connection to the same test box connector module.

4. The assembly of claim 3, wherein the key is used to identify each of the more than one harness-specific connector by reference to a user-defined list or database.

5. The assembly of claim 4, wherein the key comprises a hardware coded key.

6. A method for identifying a test box connector module used in testing an installed wiring harness comprising an existing harness connector, the method comprising:
   providing the test box connector module connected to a harness-specific connector which is for connecting to the existing harness connector, the harness-specific connector being a separate and distinct entity from the test box connector module;
   connecting the test box connector module to a test module;
   automatically detecting the test box connector module using the test module;
   detecting a key which is unique to the test box connector module thereby determining the identity of the test box connector module and of the harness-specific connector by reference to a user-defined list or database;
   sending the identity of the test box connector module to a user interface.

7. The method of claim 6, further comprising, from the identity of the test box connector module, identifying the harness-specific connector connected the test box connector module and sending the identity of the harness-specific connector module to the user interface.

8. The method of claim 7, wherein the harness-specific connector comprises more than one harness-specific connector and the identifying the harness-specific connector comprises, from the identity of the test box connector module, providing a list of the more than one harness-specific connector to the user interface and the sending comprises sending the list of the more than one harness-specific connector to the user interface.

9. The method of claim 8, further comprising which one of the more than one harness-specific connector is for connection to an existing harness connector of an installed wiring harness.

10. The method of claim 9, further comprising testing by switching and scanning the more than one harness-specific connector.

11. The method of claim 8, further comprising testing by switching and scanning the more than one harness-specific connector.

12. The method of claim 7, further comprising testing by switching and scanning the harness-specific connector.

* * * * *